United States Patent
Beringov et al.

(10) Patent No.: US 9,284,661 B2
(45) Date of Patent: Mar. 15, 2016

(54) PROCESS FOR THE PRODUCTION OF MULTICRYSTALLINE SILICON INGOTS BY CONTROLLING THE POSITION OF THE MELT SURFACE DURING GROWTH BY THE INDUCTION METHOD

(75) Inventors: Sergii Beringov, Kiev (UA); Volodymyr Onischenko, Kiev (UA); Anatoly Shkulkov, St. Petersburg (RU); Yuriy Cherpak, Kiev (UA); Sergii Pozigun, Dnepropetrovsk (UA); Stepan Marchenko, Kiev (UA); Andrii Shevchuk, Kiev (UA)

(73) Assignee: Solin Development B.V., Amsterdam Zuidoost (NL)

( * ) Notice: Subject to any disclaimer, the term of this patent is extended or adjusted under 35 U.S.C. 154(b) by 415 days.

(21) Appl. No.: 13/390,279

(22) PCT Filed: Aug. 20, 2010

(86) PCT No.: PCT/UA2010/000053
§ 371 (c)(1),
(2), (4) Date: Feb. 13, 2012

(87) PCT Pub. No.: WO2011/025468
PCT Pub. Date: Mar. 3, 2011

(65) Prior Publication Data
US 2012/0137473 A1      Jun. 7, 2012

(30) Foreign Application Priority Data

Aug. 25, 2009   (UA) .................................. 200908864

(51) Int. Cl.
C30B 15/08      (2006.01)
C30B 29/06      (2006.01)
C30B 11/00      (2006.01)

(52) U.S. Cl.
CPC ............... *C30B 29/06* (2013.01); *C30B 11/001* (2013.01); *C30B 11/003* (2013.01); *C30B 11/006* (2013.01)

(58) Field of Classification Search
CPC ........ C30B 15/00; C30B 15/02; C30B 15/05; C30B 15/14; C30B 15/20; C30B 15/08; C30B 15/22
USPC ........ 117/11, 13–15, 23, 30, 33, 73, 928, 931
See application file for complete search history.

(56) References Cited

U.S. PATENT DOCUMENTS 6,027,563 A * 2/2000 Choudhury et al. ............ 117/18
2007/0039544 A1 * 2/2007 Kaneko ........................... 117/81

* cited by examiner

*Primary Examiner* — Kenneth A Bratland, Jr.
(74) *Attorney, Agent, or Firm* — Weiner & Burt, P.C.; Irving M. Weiner; Pamela S. Burt

(57) ABSTRACT

A process for the production of multicrystalline silicon ingots by the induction method comprises charging a silicon raw material into the melting chamber of a cooled crucible enveloped by an inductor, forming a melt surface, and melting, wherein the mass rate of charging the silicon raw material and the speed of pulling the ingot are set such that provide for the melt surface position below the upper plane of the inductor but not lower than ⅓ of the height thereof and the melt surface is kept at the same level. In doing this the melt surface position is kept at the same level by maintaining one of the output parameters of the inductor feed within a predetermined range. The process provides for casting multicrystalline silicon ingots suitable for solar cell fabrication and it is notable for higher efficiency and lower specific energy consumption.

2 Claims, 1 Drawing Sheet

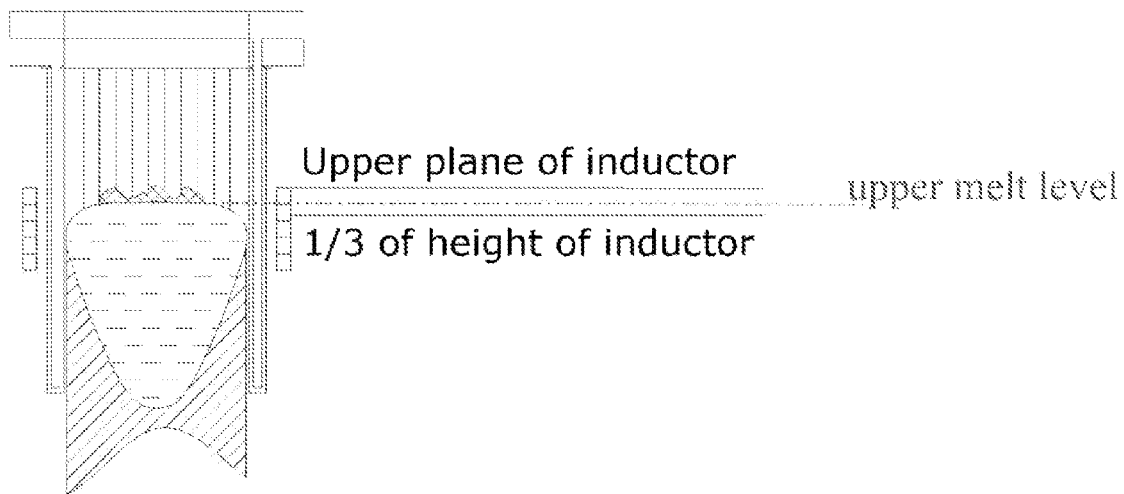

PROCESS FOR THE PRODUCTION OF MULTICRYSTALLINE SILICON INGOTS BY CONTROLLING THE POSITION OF THE MELT SURFACE DURING GROWTH BY THE INDUCTION METHOD

TECHNICAL FIELD

The present invention relates to the production of polycrystalline silicon, particularly to the production of multicrystalline silicon by the induction method, and can be used in manufacturing solar cells from multicrystalline silicon.

Crystal silicon is used for producing solar cells to convert solar energy into electrical energy. Much attention has been recently given to the production of polycrystalline silicon formed by large crystals, typically referred to as multi-crystal silicon, which provides for the efficiency of converting solar energy into electric energy close to that of single-crystal silicon.

BACKGROUND ART

Processes for the production of polycrystalline silicon ingots are disclosed in the following documents: US Pat. No. 4,572,812 (Int. Cl. B29D 7/02, B22D 27/02 [1]), EP Pat. No. 1254861 (publ. 06.11.2002, (Int. CI. C01B 33/02 [2]), EP Pat. No. 1754806 (publ. 21.02.2007, (Int. Cl. C30B 11/00 [3]) and consist in charging a silicon raw material into the melting chamber of a cooled crucible enveloped by an inductor, forming a melt surface, melting and pulling the multicrystalline silicon ingot. None of the processes, however, describes melting conditions and ingot pulling conditions, which provide for sustained conditions for melt crystallization.

A process for the production of multicrystalline silicon ingots by the induction method, the process bearing closely on the invention, comprises charging a silicon raw material into the melting chamber of a cooled crucible enveloped by an inductor, forming a melt surface, melting while monitoring the output parameters of the inductor feed, and pulling the multicrystalline silicon ingot under controlled cooling conditions (EP Pat. No. 1930483, Int. Cl. C30B 35/00, C30B 29/06, C01B 33/02, publ. 22.02.2007, [4]). In the prior art process, melting is controlled by monitoring the output power of the inductor feed, wherein the measured frequency of an inverter is compared with the preset frequency thereof, and the output power of the heating means feed is simultaneously monitored, wherein the measured temperature on the ingot surface is compared with the preset temperature on the ingot surface.

Under such conditions, however, the crystallization of silicon in the ingot is unstable, because a constant changing of the output power of the inductor feed in the prior art process leads to a constant change in the rate of ingot crystallization to thereby unfavorably affect its quality.

Also, according to the prior art process, an increase in the depth of the melt requires a decrease in the output power of the inductor feed. In case of an increase in the depth of the melt by raising the melt surface, the operating frequency is increased and the output power of the inductor feed is decreased. On the one hand, these dependencies result in an increase in the rate of melt crystallization and, on the other, in a decrease in the rate of melting the charged raw material, and it can result in a complete filling up of the melt surface with the raw material and its sticking to the walls of the cooled crucible. In consequence, the pulling of the ingot will be forced to stop to melt down the raw material bridging the crucible, the regular melting process disrupted, the rate of melting slowed, and the production efficiency reduced.

The present invention is aimed at an improvement in the process for the production of multicrystalline silicon ingots by the induction method, wherein silicon crystallization would become stable, ingot quality higher, and production efficiency increased due to suggested process steps.

SUMMARY OF THE INVENTION

To the accomplishment of the foregoing objective, there is provided a process for the production of multicrystalline silicon ingots by the induction method, the process comprising charging a silicon raw material into the melting chamber of a cooled crucible enveloped by an inductor, forming a melt surface, melting while monitoring the output parameters of the inductor feed, and pulling the multicrystalline silicon ingot under controlled cooling conditions, wherein, in the course of melting, the mass rate of charging the silicon raw material and the speed of pulling the ingot are set such that provide for the melt surface position below the upper plane of the inductor but not lower than $1/3$ of the height thereof and the melt surface is kept at the same level. In doing this the melt surface position is kept at the same level by maintaining one of the output parameters of the inductor feed within a predetermined range, notably, operating frequency, voltage, current.

In casting multicrystalline silicon ingots by the induction method, it was experimentally established that with the melt surface position below the upper plane of the inductor but not lower than $1/3$ of the height thereof, the maximum rate of melting was achieved, and with the melt surface position maintained at this level by setting the mass rate of charging the silicon raw material, the speed of pulling the ingot, and the output parameters of the inductor feed, such as operating frequency, voltage or current of the inductor, silicon stably crystallized.

BRIEF DESCRIPTION OF THE DRAWING

The drawing shows the melt surface position below the upper plane of the inductor but not lower than $1/3$ of the height of the inductor.

BEST MODE FOR CARRYING OUT THE INVENTION

To melt the raw material, heat is consumed as the enthalpy of the raw material and of the melting heat that is absorbed at the interface of solid and liquid phases. Since heating mainly involves the liquid phase, i.e., silicon melt, the electromagnetic energy release is limited where heat is absorbed at such position of the inductor with respect to the melt surface. As a result, the rate of melting is increased due to the melt being mixed and due to overheated melt flow coming from the zone of induced currents to the zone of melting the silicon raw material, and melting is stable and fast to provide further stability to silicon crystallization. Grain cross-sectional sizes of thus produced ingots meet the specifications of solar-cell producers for wafer grain sizes, and the ingots thus produced are suitable for the manufacture of solar cells. Also, ingot production efficiency is enhanced, specific energy consumption is decreased.

The invention operates as follows.

In a chamber, under a controlled argon atmosphere, a movable bottom is moved to delimit a melting chamber and a silicon raw material is charged into the melting chamber. A high-frequency electromagnetic field is created by an inductor that envelopes a cooled crucible. A start-up heating device is inserted into the melting chamber that is inside the high-frequency electromagnetic field created by the inductor. The start-up heating device gets heated up, and the silicon raw material warms up and melts under the influence of radiated heat from the start-up heating device and the electromagnetic field created by the Inductor. The start-up heating device is removed from the electromagnetic field, while in the melting chamber, a melt pool is produced in the form of the cross section of the melting chamber. As a result of the heat transfer along the periphery of the melt pool, the melt is crystallized and a skull Is formed to prevent the pool from spilling from the melting chamber. After the melt pool is formed, the silicon raw material is continuously supplied onto the surface of the melt. In the course of melting, the mass rate of charging the silicon raw material and the speed of pulling the ingot are set such that provide for the melt surface position below the upper plane of the inductor from 1/12 to 1/4.8 of the height of the inductor (as shown in the drawing) and the melt surface is kept at the same level, for example, by maintaining operating frequency, voltage or current of the inductor within a predetermined range, or otherwise.

The invention is further described by way of examples.

Example 1

Multicrystalline silicon ingots were obtained by the induction melting technique using an apparatus with a melting chamber of a square cross-section and a side length of 350 mm. In a chamber, under an argon atmosphere, a movable bottom is moved to delimit a melting chamber of a cooled crucible enveloped by an inductor 120 mm high. A lump silicon raw material is charged into the melting chamber. A high-frequency electromagnetic field is created. A start-up heating device is inserted into the melting chamber, the lump silicon raw material is warmed up and melted, the start-up heating device is removed from the electromagnetic field, and a melt pool is produced in the form of the cross section of the melting chamber. The melt is crystallized and a skull is formed along the periphery of the melt pool. The silicon raw material of a particle size in the range of 15-20 mm is continuously supplied onto the surface of the melt. The output power of the inductor feed is set at 300 kW, the mass rate of charging the silicon raw material was set at about 0.4 kg per minute, the speed of pulling the ingot was set at 1.5 mm per minute, and the melt surface position was set at 25 mm below the upper plane of the inductor. The operating frequency of the inductor feed was 16.7 kHz. In the course of melting, the melt surface was kept at the same level with the operating frequency of the inductor feed maintained in the range of 16.7±0.05 kHz. The frequency was maintained within the range by way of adjusting the mass rate of charging the silicon raw material, the speed of pulling the ingot being constant. In the course of melting, the mass rate of charging the silicon raw material was adjusted within the range of 0.40-0.45 kg per minute depending on accidental variations in the raw material variables, particularly particle sizes and feeder accuracy as well. To relieve thermal stresses as the ingots grow, it is annealed in an annealing chamber and cooled under controlled conditions. Due to a constant output power of the inductor feed and to a constant speed of pulling the ingot, the crystallization front becomes stable at a single level. As a result, optimal conditions of crystal growth in a multicrystalline silicon ingot are created. Also, the position of the melt surface 25 mm lower than the upper plane of the inductor allows the maximum speed of pulling the ingot produced from the raw material of the given particle size. This is achieved by the electromagnetic coupling of the inductor with the melt surface zone. Following annealing and controlled cooling, the multicrystalline silicon ingot is taken out from the annealing chamber and cut into blocks from which wafers are subsequently cut for use in the production of solar cells.

The efficiency of the process for the production of multicrystalline silicon ingots is 25.7 kg per hour. Grain cross-sectional sizes of thus produced ingots meet the specifications of solar-cell producers for wafer grain sizes.

Example 2

Multicrystalline silicon ingots were obtained by the induction melting technique in a way similar to that described in Example 1. The output power of the inductor feed and the particle size of the silicon raw material were similar to those of Example 1. The mass rate of charging the silicon raw material was set at 0.3 kg per minute, the speed of pulling the ingot was set at 1.2 mm per minute, and the melt surface position was set at 5 mm below the upper plane of the inductor. The operating frequency of the inductor feed was 16.9 kHz. In the course of melting, the melt surface was kept at the same level with the operating frequency of the inductor feed maintained in the range of 16.9±0.05 kHz. The frequency was maintained within the range by way of adjusting the mass rate of charging the silicon raw material, the speed of pulling the ingot being constant. In the course of melting, the mass rate of charging the silicon raw material was adjusted within the range of 0.32-0.37 kg per minute depending on accidental variations in the raw material variables, particularly particle sizes and feeder accuracy as well.

The efficiency of the process for the production of multicrystalline silicon ingots is 20.6 kg per hour. Grain cross-sectional sizes of thus produced ingots meet the specifications of solar-cell producers for wafer grain sizes.

Example 3

Multicrystalline silicon ingots were obtained by the induction melting technique in a way similar to that described in Example 1. The output power of the inductor feed and the particle size of the silicon raw material were similar to those of Example 1. The mass rate of charging the silicon raw material was set at 0.4 kg per minute, the speed of pulling the ingot was set at 1.3 mm per minute, and the melt surface position was set at 10 mm below the upper plane of the inductor. The operating current of the inductor feed was 4650 A. In the course of melting, the melt surface was kept at the same level with the current of the inductor feed maintained in the range of 4650±5 A. The current was maintained within the range by way of adjusting the mass rate of charging the silicon raw material, the speed of pulling the ingot being constant. In the course of melting, the mass rate of charging the silicon raw material was adjusted within the range of 0.35-0.40 kg per minute depending on accidental variations in the raw material variables, particularly particle sizes and feeder accuracy as well.

The efficiency of the process for the production of multicrystalline silicon ingots is 22.3 kg per hour. Grain cross-sectional sizes of thus produced ingots meet the specifications of solar-cell producers for wafer grain sizes.

The proposed invention ensures an increased output of multicrystalline silicon and casting of multicrystalline silicon ingots of higher quality, which are suitable for solar cell fabrication.

The invention claimed is:

1. A process for the production of multicrystalline silicon ingots by controlling a position of a melt surface during growth by the induction method, the process comprising the steps of:
    charging a silicon raw material into a melting chamber of a cooled crucible enveloped by an inductor;
    forming a melt surface;
    melting while monitoring output parameters of an inductor feed;
    pulling a multicrystalline silicon ingot under controlled cooling conditions; and
    in the course of melting, setting mass rate of charging the silicon raw material and a speed of pulling the multicrystalline ingot such that an upper melt surface position is provided below an upper plane of the inductor from 1/12 to 1/4.8 of a height of the inductor, and the upper melt surface position is kept at the same level.

2. The process according to claim 1, wherein:
    the upper melt surface position is kept at the same level by maintaining one of the output parameters of the inductor feed within a predetermined range, the operating parameters being operating frequency, voltage, and current.

* * * * *